(12) United States Patent
Beasom

(10) Patent No.: US 6,894,349 B2
(45) Date of Patent: May 17, 2005

(54) LATERAL DMOS STRUCTURE WITH LATERAL EXTENSION STRUCTURE FOR REDUCED CHARGE TRAPPING IN GATE OXIDE

(75) Inventor: James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/104,342

(22) Filed: Mar. 22, 2002

(65) Prior Publication Data

US 2002/0185696 A1 Dec. 12, 2002

Related U.S. Application Data

(63) Continuation-in-part of application No. 09/877,272, filed on Jun. 8, 2001, now abandoned.

(51) Int. Cl.[7] ............................................. H01L 29/76
(52) U.S. Cl. ........................ 257/343; 257/339; 257/342
(58) Field of Search ................................ 257/335, 339, 257/342, 343

(56) References Cited

U.S. PATENT DOCUMENTS

| 4,712,124 A | | 12/1987 | Stupp |
| 4,902,901 A | * | 2/1990 | Pernyeszi .................... 250/551 |
| 5,138,177 A | * | 8/1992 | Morgan et al. ............. 250/551 |
| 5,313,082 A | | 5/1994 | Eklund |
| 5,705,842 A | | 1/1998 | Kitamura et al. |
| 5,763,927 A | | 6/1998 | Koishikawa |
| 2001/0038122 A1 | | 11/2001 | Matsuzaki et al. |

FOREIGN PATENT DOCUMENTS

| EP | 0 115 098 | 8/1984 |
| JP | 401238062 | 9/1989 |
| JP | 404107870 | 4/1992 |

OTHER PUBLICATIONS

Nezer et al., Optimization of the Breakdown Voltage in LDMOS Transistors Using Internal Field Rings, 1991, IEEE, CH2987, pp. 149–153.

* cited by examiner

Primary Examiner—George Eckert
(74) Attorney, Agent, or Firm—Fogg and Associates, LLC; Scott V. Lundberg

(57) ABSTRACT

A high voltage lateral semiconductor device for integrated circuits with improved breakdown voltage. The semiconductor device comprising a semiconductor body, an extended drain region formed in the semiconductor body, source and drain pockets, a top gate forming a pn junction with the extended drain region, an insulating layer on a surface of the semiconductor body and a gate formed on the insulating layer. In addition, a higher-doped pocket of semiconductor material is formed within the top gate region that has a higher integrated doping than the rest of the top gate region. This higher-doped pocket of semiconductor material does not totally deplete during device operation. Moreover, the gate controls, by field-effect, a flow of current through a channel formed laterally between the source pocket and a nearest point of the extended drain region.

32 Claims, 8 Drawing Sheets

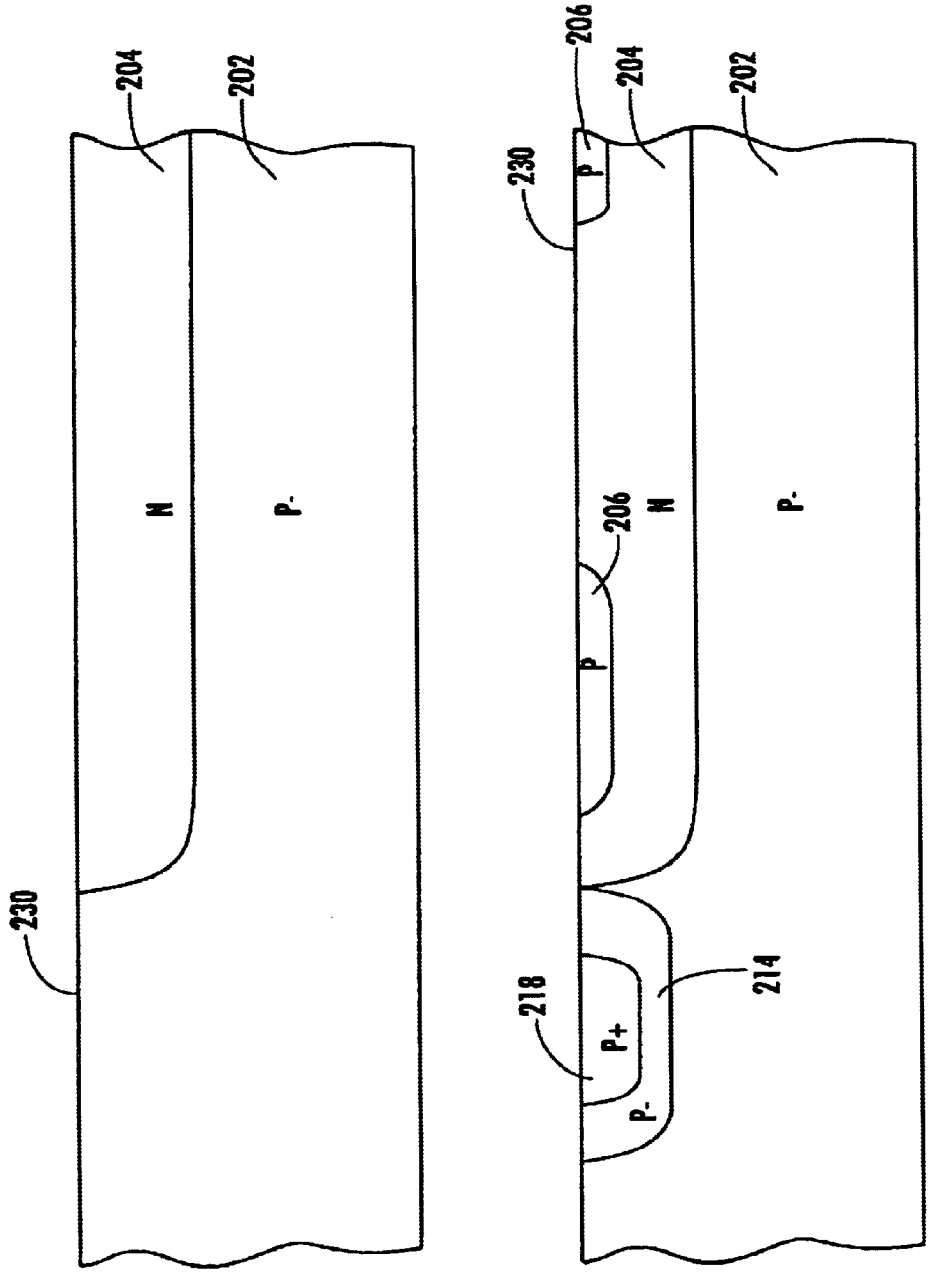

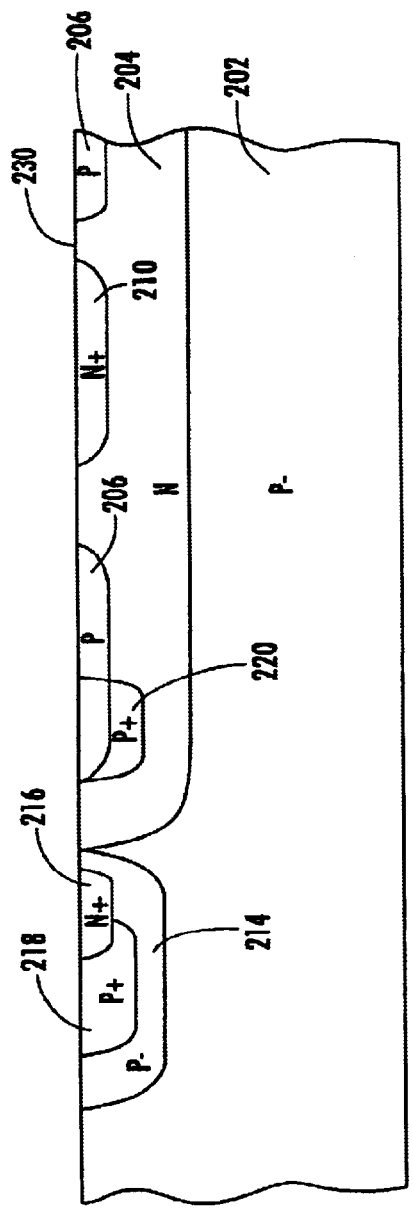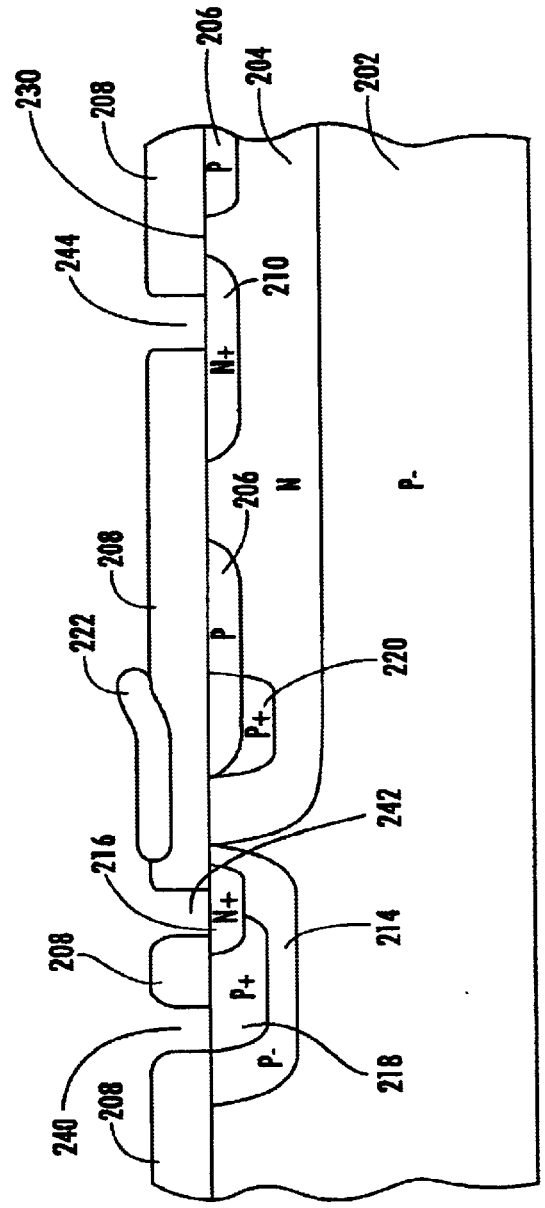
FIG. 2C
FIG. 2D

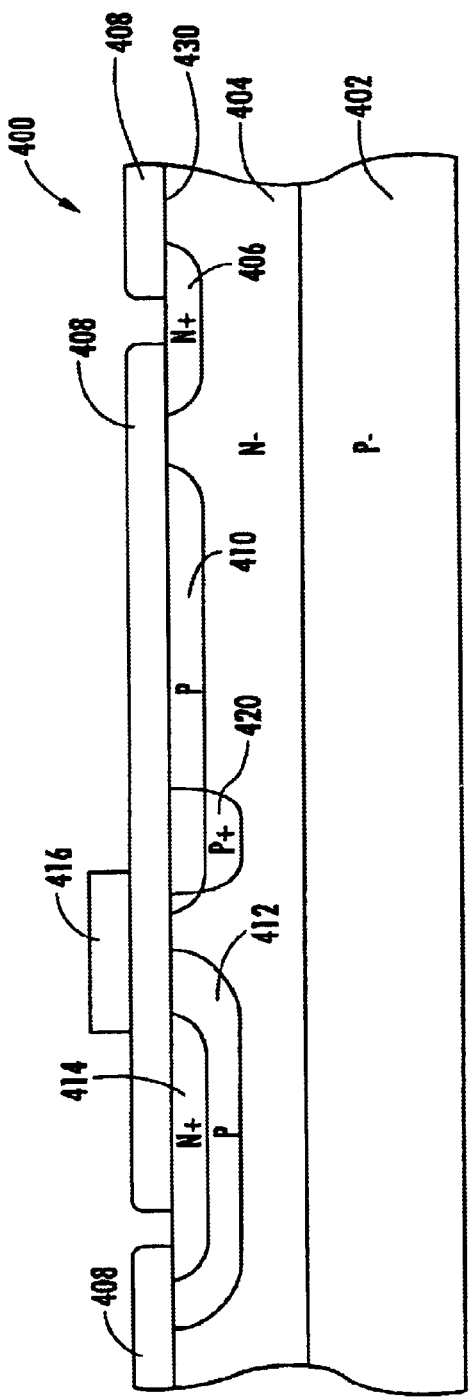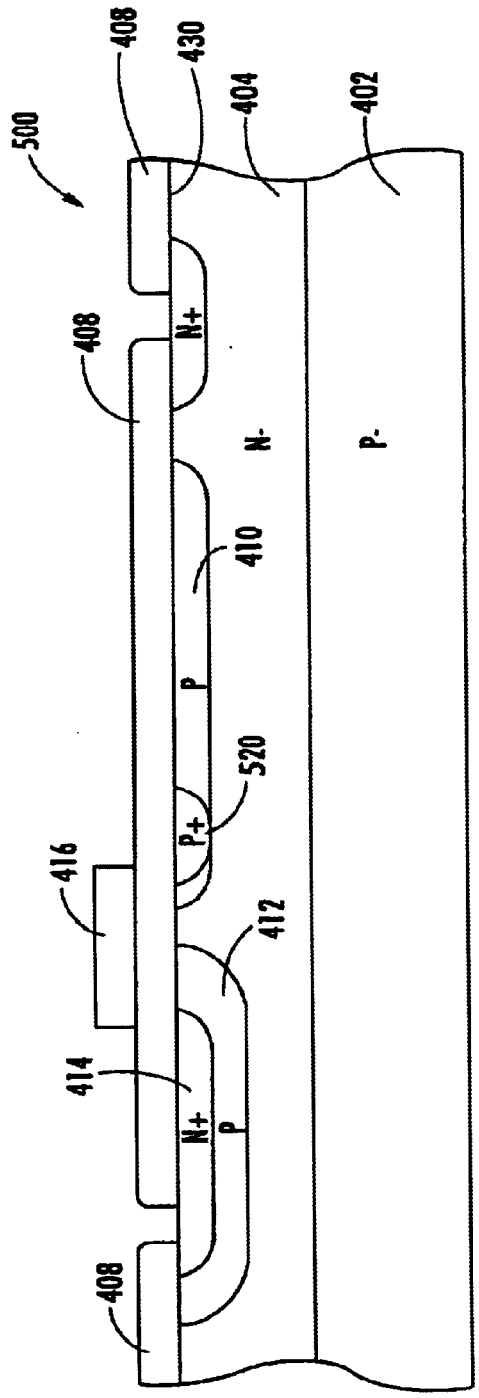

US 6,894,349 B2

LATERAL DMOS STRUCTURE WITH LATERAL EXTENSION STRUCTURE FOR REDUCED CHARGE TRAPPING IN GATE OXIDE

CROSS-REFERENCE TO RELATED APPLICATIONS

This is a continuation-in-part application of U.S. application Ser. No. 09/877,272 filed on Jun. 8, 2001, now abandoned the disclosures of which are herein specifically incorporated by this reference.

TECHNICAL FIELD

The present invention relates generally to integrated lateral semiconductor devices and specifically to high voltage lateral semiconductor devices for integrated circuits with improved breakdown voltage.

BACKGROUND

A typical use of a power metal-oxide-semiconductor field-effect transistor (MOSFET) in an integrated circuit is in forming an electronic switch circuit. Two important characteristics of a MOSFET when used in a power switch circuit are its breakdown voltage and its ON resistance. The breakdown voltage is a measure of the MOSFET's ability to withstand voltage when it is in an OFF or open condition. The ON resistance is a measure of the resistance when the MOSFET is in an ON or closed condition. Improving the operation of a power switch circuit incorporating MOSFETs suggests using a MOSFET with a breakdown voltage as high as possible and an ON resistance as low as possible. A perfect switching device has an infinite breakdown voltage and zero ON resistance. Examples of high voltage semiconductor devices with relatively high breakdown voltages and relatively low ON resistances are disclosed in U.S. Pat. Nos. 4,823,173 and 5,264,719, which are herein incorporated by reference. It is desired in the art to have a MOSFET with further improved breakdown voltage and ON resistance.

For the reasons stated above, and for other reasons stated below which will become apparent to those skilled in the art upon reading and understanding the present specification, there is a need in the art for a lateral DMOS structure with improved breakdown voltage and ON resistance.

SUMMARY

The above-mentioned problems and other problems are addressed by the present invention and will be understood by reading and studying the following specification.

In one embodiment, a metal-oxide-semiconductor transistor is disclosed. The metal-oxide-semiconductor transistor comprises a semiconductor body, a pair of laterally spaced source and drain pockets, an extended drain region, a top gate, a higher-doped pocket, an insulating layer and a gate. The semiconductor body is of a first or a second conductivity type having a surface. The pair of laterally spaced source and drain pockets of semiconductor material of a second conductivity type are within the semiconductor body and adjoin the semiconductor body surface. The extended drain region of the second conductivity type extends laterally in at least one direction away from the drain pocket and is contiguous with the semiconductor body surface. The top gate region is within the extended drain region, forms a pn junction with the extended drain region and is of the first conductivity type. The higher-doped pocket of semiconductor material is of the first conductivity type, is within the top gate region and has a higher integrated doping than the top gate region. The insulating layer is on the surface of the semiconductor body and covers at least that portion of the surface between the source pocket and a farthest edge, with respect to the drain pocket, of the extended drain region. The gate is on the insulating layer and is electrically isolated from the semiconductor body thereunder forming a channel laterally between the source pocket and the nearest point of the extended drain region. The gate electrode controlling, by field-effect, the flow of current thereunder through the channel.

In another embodiment, an integrated MOS/JFET transistor device is disclosed. The integrated MOS/JFET transistor device comprises an insulated gate field-effect transistor and a top and bottom gate junction field-effect transistor integrated in a semiconductor substrate comprising a source region, and a drain region and a dual channel path formed in the semiconductor substrate between the source and the drain regions. The dual channel path comprises an insulated gate-controlled channel region has a first conductivity type in the presence of a channel inducing gate voltage. The insulated gate controlled channel region is contiguous with a top and bottom gate junction field-effect transistor channel region of the first conductivity type. The source region adjoins the insulated gate-controlled channel region and the drain region adjoins the top and bottom gate junction field-effect transistor channel region. In addition, a portion of a top and bottom gate junction field effect transistor top gate comprises a higher integrated doping than the remainder of the top and bottom gate junction field effect transistor top gate.

In another embodiment, a method of fabricating a metal-oxide semiconductor transistor in an integrated circuit is disclosed. The method comprises forming an insulator on the surface of the semiconductor body. Forming a gate on the insulator between the source and drain pockets and overlapping the source pocket. Forming an extended drain region of the first conductivity type in the surface of the semi-conductor body, extending at least from the drain pocket to the nearest edge of the gate. Forming a top gate of a second conductivity type in the surface of the extended drain region such that a pn junction is formed with the extended drain region. In addition, forming a portion of the top gate having a higher integrated doping.

In another embodiment, a lateral MOS device for an integrated circuit is disclosed. The lateral MOS device includes an island, a source, a drain, a top gate, a drift region, a non-depleting region, a gate and an insulating layer. The island is made of semiconductor bulk material of a first conductivity type with low dopant density and has a first surface. The source is of a second conductivity type with high dopant density and is formed in the island adjacent the first surface of the island. The drain is of the second conductivity type with high dopant density and is formed in the island adjacent the first surface of the island a select distance from the source. The top gate of the first conductivity type and is formed in the island laterally positioned between the source and the drain. The top gate is further formed adjacent the surface of the island. The non-depleting region is of the first conductivity type with high dopant density and extends from the first surface of the island into a first portion of the top gate. The gate is generally positioned laterally between the source and the top gate. In addition, the insulating layer is positioned between the gate and the second surface of the drift region. The drift region is of the second conductivity type and is positioned adjacent the first surface of the island. The drift region extends laterally beneath the first surface of the island at least from the gate to the drain.

In another embodiment, a solid state relay for an integrated circuit is disclosed. The solid state relay includes, a photo diode stack, a first high voltage lateral DMOS and a second high voltage lateral DMOS. The photo diode stack is used to drive a voltage having a first output and a second output. The first high voltage lateral DMOS has a gate, source and drain. The gate of the first high voltage DMOS is coupled to the first output of the photo diode stack. The source of the first high voltage DMOS is coupled to the second output of the photo diode stack. The second high voltage lateral DMOS has a gate, source and drain. The gate of the second high voltage lateral DMOS is coupled to the first output of the photo diode stack. The source of the second high voltage lateral DMOS is coupled to the second output of the photo diode stack. The first and second high voltage lateral DMOS comprise a substrate, a body region, a source, a drain, a drift region, a top gate, a non-depleting region, an insulating layer and a gate. The substrate is of a first conductivity type with low dopant density and has a first surface. The body region is of the first conductivity type and is adjacent the first surface of the substrate. The source is of a second conductivity type with high dopant density and is positioned in the body region adjacent the first surface of the substrate. The drain is of the second conductivity type with high dopant density and is positioned adjacent the first surface of the substrate and a select distance from the source. The drift region is of a second conductivity type with low dopant density. The top gate is of the first conductivity type. The top gate is formed in the drift region between the source and the drain and is positioned adjacent the first surface of the substrate. The non-depleting region is of the first conductivity type with high dopant density. The non-depleting region extends vertically from the first surface of the substrate into a portion of the top gate. The insulating layer overlays at least a portion of the first surface of the substrate. The gate overlays a portion of the insulating layer. Moreover, the gate is generally positioned laterally between the source and the top gate. The drift region is positioned adjacent the first surface of the substrate and extends laterally below the first surface of the substrate at least from the gate to the drain.

In another embodiment, a method of forming a MOS device in an integrated circuit is disclosed. The method comprising forming a drift region of second conductivity type in a substrate of first conductivity type with low dopant density, wherein the drift region extends vertically to a select depth from a first surface of the substrate. Forming a body region of the first conductivity type in the substrate adjacent the first surface of the substrate. Forming a source of the second conductivity type with high dopant density in the body region adjacent the first surface of the substrate. Forming a drain of the second conductivity type with high dopant density in the drift region adjacent the first surface of the substrate and a select distance from the source. Forming a top gate of the first conductivity type positioned laterally between the source and the drain and adjacent the first surface of the substrate. Forming a non-depleting region of the first conductivity type with higher integrated doping than that of the top gate extending into a portion of the top gate. Forming an insulating layer overlaying the first surface of the substrate. In addition, forming a gate on the insulating layer positioned laterally between the source and at least a portion of the top gate.

In still another embodiment, another method of forming a MOS device in an integrated circuit is disclosed. The method comprising forming an epitaxial drift region of a second conductivity type with low dopant density on a substrate of first conductivity type with low dopant density, wherein the drift region has a first surface adjacent the substrate and a second surface opposite the first surface. Forming a body region of the first conductivity type in the drift region adjacent the second surface of the drift region. Forming a source of the second conductivity type with high dopant density in the body region adjacent the second surface of the substrate. Forming a drain of the second conductivity type with high dopant density in the drift region adjacent the second surface of the substrate and a select distance from the source. Forming a top gate of the first conductivity type in the drift region laterally positioned between the source and the drain and adjacent the second surface of the drift region. Forming a non-depleting region of the first conductivity type with higher integrated dopant the top gate extending from the second surface of the drift region into a portion of the top gate. Forming an insulation layer on the second surface of the drift region. In addition, forming a gate overlaying the insulation layer, the gate is generally positioned laterally between the source and the top gate.

BRIEF DESCRIPTION OF THE DRAWINGS

The present invention can be more easily understood and further advantages and uses thereof more readily apparent, when considered in view of the description of the preferred embodiments and the following figures in which:

FIGS. 2(A–D) are cross-sectional views illustrating the formation of one embodiment of the present invention;

FIG. 4 is a cross-sectional view of still another embodiment of the present invention;

FIG. 5 is a cross-sectional view of further still another embodiment of the present invention.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention incorporate a nondepleting region in a top gate of a lateral MOS device for an integrated circuit. In the following description, the term "substrate" is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. The term "island" refers to an area in the substrate containing a semiconductor device. The use of the letter "P" denotes a semiconductor region with P type dopants. The use of the letter "N" denotes a semiconductor region with N type dopants. Moreover, a "−" denotes a low dopant density and a "+" denote a high dopant density.

Terms of relative position as used in this application are defined based on a plane parallel to the conventional plane or working surface of a wafer (substrate or island formed in the substrate), regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms, such as "on," "side," "right," "left," "higher," "lower," "below," "over," "top" and "under" are defined with respect to the conventional plane or working surface being on the top surface of the wafer or substrate, regardless of the orientation of the wafer or substrate. Before a detailed discussion of the embodiments of the present invention are described, further background is first provided to aid in the understanding of the embodiments of the present invention.

Figure 1:
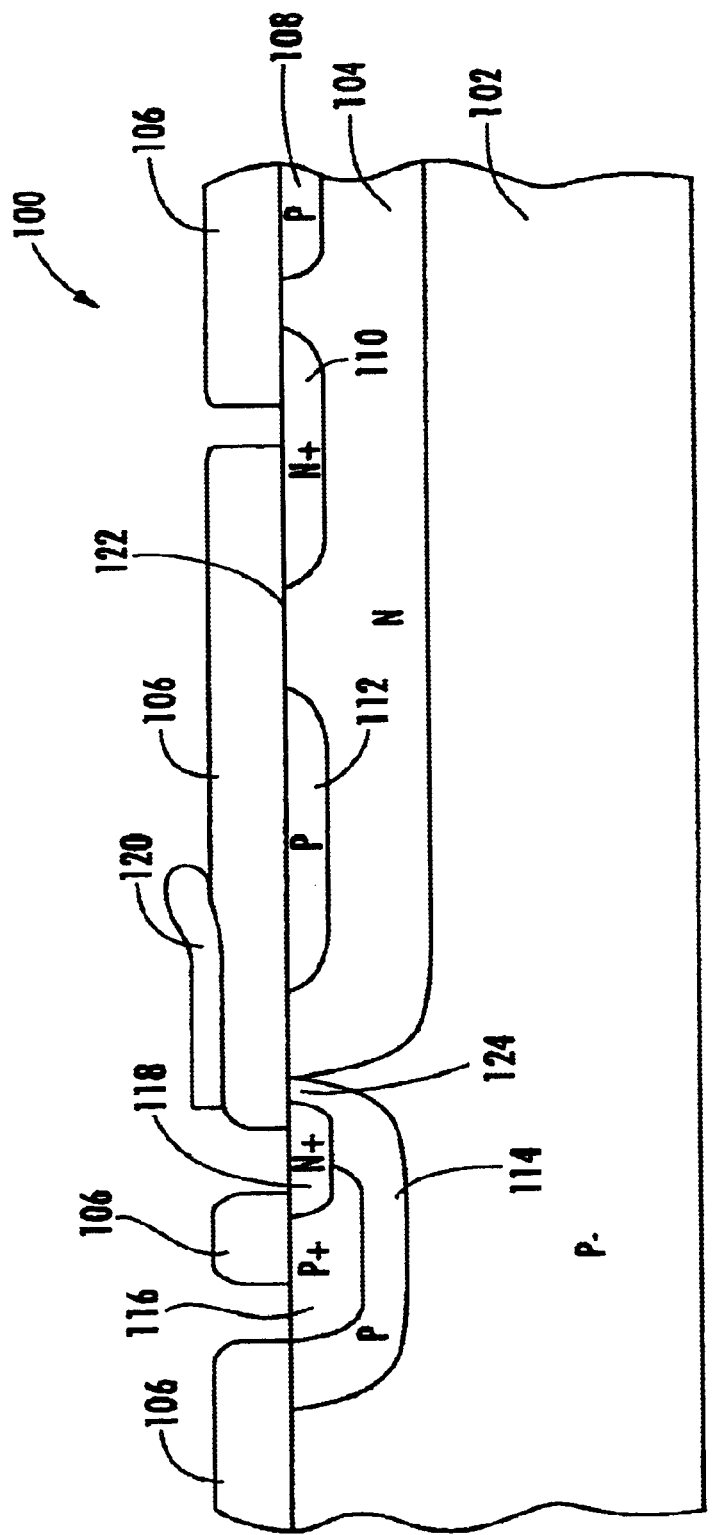
FIG. 1 is a cross-sectional side view of a lateral DMOS of the prior art.

Referring to FIG. 1, a lateral double-diffused metal-oxide-semiconductor (LDMOS) device 100 of the prior art is illustrated. As illustrated, the LDMOS device 100 includes a P− island 102 upon which an N drift region 104 is formed. The island 102 is formed in a substrate of semiconductor bulk material. The N drift region 104 is formed along a working surface 122 of the P− island 102. The LDMOS device also includes a N+ drain 110, a N+ source 118 and a P+ body contact 116. Both the source 118 and body contact 116 are formed in a P body shield region 114. A device channel region is designated by reference character 124 below a gate 120. The device 100 further includes a P JFET top gate region 112 formed in the drift region 104 adjacent the working surface 122 of the island 102. Both the drift region 104 and the top gate 112 extend laterally beneath a portion of gate 120. Typically a masked alignment process is used to form the separation between the top gate 112 and the drain 110.

Simulations of the embodiment of FIG. 1 operated at a drain to source voltage high enough to totally deplete both the drift region 104 and the JFET top gate 112, reveal paths along which the holes and electrons generated thermally and by avalanche multiplication flow through the depletion layer to the device terminals. In a NMOS device, holes separate into two paths along an approximately horizontal line with respect to the working surface 122 of the island 102. Moreover, the holes run through drift region 104. The holes below the line flow down to into the undepleted island 102. The holes above the line flow up toward the depleted top gate 112 and then flow horizontally along the working surface 122 of the island 102 passing under gate 120 and into body 114.

It is known that holes and electrons flowing through a region of high fields, such as the depleted region referred to above, gain energy and are therefore called hot carriers. Some of these hot carriers pass through and degrade the gate oxide and are collected as gate current. Others become trapped in gate oxide interface traps between the semiconductor (island 102) and the insulator 106 or within oxide bulk. These additional fixed oxide charges affect operation of the device. Also, the barrier for hole injection into the valence band between silicon and silicon dioxide is higher than the barrier for injection of electrons into the conduction band. Trapped holes in the silicon dioxide provide a positive charge that reduces the threshold voltage. Trapped electrons increase the threshold voltage. If the shift in threshold voltage is large, the device ceases to properly function.

The above-mentioned trappings effects can be reduced in accordance with the teachings of the present invention. According to the teachings of the present invention, the top gate of the drift region of embodiments of MOS devices include a section having an increased doping concentration that does not totally deplete. The holes flow through the top gate into the undepleted portion thereof, where they loose their energy during scattering events. This energy cannot be regained due to the absence of a high electric field in the nondepleted region. The holes then flow under the gate 120 at a lower energy and into body region 114 (P body shield region 114). Because the holes (and electrons in a P channel device) have significantly reduced energy in the region under gate 120, there is a significant reduced probability for trapping in interface traps or in the bulk silicon dioxide dielectric in that region.

Figure 2:
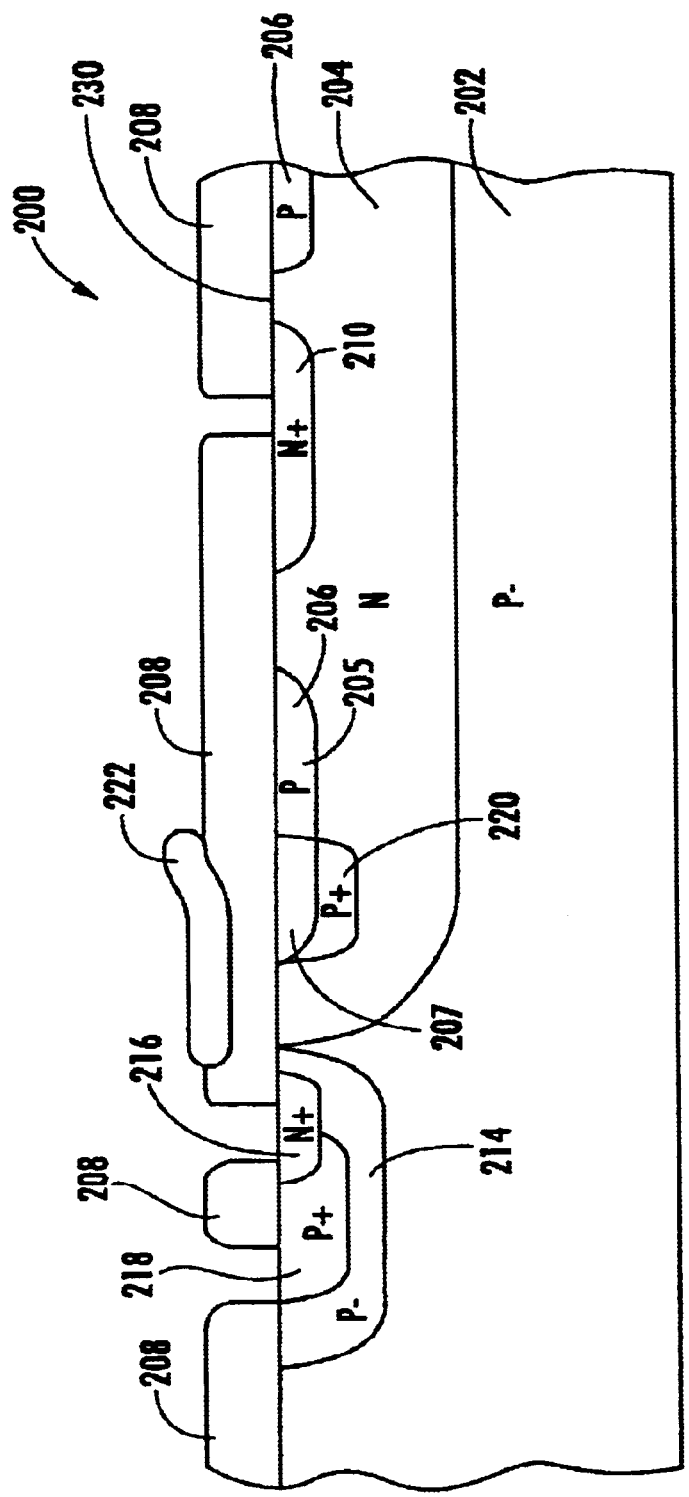
FIG. 2 is a cross-sectional view of one embodiment of the present invention.

Referring to FIG. 2, one embodiment of a lateral MOS device 200 (MOSFET device 200) of the present invention is illustrated. As illustrated, this embodiment includes a P− substrate 202 of an integrated circuit. More particularly, FIG. 2 illustrates an P− island 202 portion of the P− substrate 202. A N drift region 204 or extended drain region 204 is formed in the substrate 202 adjacent a working surface 230 of the substrate 202. The MOS device 200 is also illustrated as including P top gates 206 (JEFT top gates 206), N+ drain 210 (drain pocket 210), N+ source 216 (source pocket 216), P+ body contact 218, P− body 214, insulation layer 208 and gate 222. The extended drain region 204 is a carrier drift region that operates as a junction field effect transistor channel.

Further illustrated in the embodiment of FIG. 2 is non-depleting region 220 or higher doped pocket of semiconductor material 220. In this embodiment, non-depleting region 220 extends downward from the working surface 230 of the substrate 202 through the top gate 206 and partially into drift region 204. The non-depleting region 220 is formed to extend laterally to at least an edge of gate 222. In fact, in the embodiment illustrated in FIG. 2, a portion of the non-depleting region 220 under-laps a portion of gate 222. The vertical junction depth of the non-depleting region 220 is less than the vertical junction depth of the extended drain region 204. In addition, in one embodiment, the non-depleting region 220 is also formed as a region in a base of a bipolar junction transistor.

Non-depleting region 220 does not totally deplete during device operation even when the top gate 206 is depleted. Therefore, as the holes flow through the non-depleting region 220, they lose energy during scattering events. As the holes leave the non-depleted region 220 and flow under gate 222, they have a lower energy and therefore a reduced probability of being trapped in either interface traps or bulk dielectric traps. Non-depleting region 220 does not degrade the breakdown voltage of the MOSFET device 200 because it is operated at or near the voltage of the P− island 202. Gate 222 is also operated near the P– island voltage (typically within 20 volts). Thus, no high field region is generated in the area of the source 216. In addition, non-depleting region 220 is separated from drain 210 by a portion of depletable top gate 206. Stated another way, the top gate has a first depleting portion 205 and a second non-depleting portion 207 formed by the non-depleting region 220. The depletable characteristics of the first depletable portion 205 of the top gate 206 prevents premature breakdown between the drain 210 and the second non-depleting portion 207 of the top gate. Although, FIG. 2, illustrates a NMOS device 200, it will be understood in the art that the conductivity types illustrated in the various regions can be reversed to form a PMOS device.

An illustration of one method of forming the embodiment of FIG. 2 is illustrated in FIGS. 2(A–D). Referring to FIG. 2A, drift region 204 of this embodiment is formed by a masked implant of N conductivity type dopants into the working surface 230 of the P– substrate 202 followed by diffusion. Pockets of device regions are then formed adjacent the working surface 230 of the substrate by masked implant and diffusion. This is illustrated in FIG. 2B. In particular, P top gates 206 are formed by the masked implant of P conductivity type dopants. P– Body 214 is formed by masked implant of P conductivity type dopants having low dopant density. The P+ body contact 218 is formed by masked implant of P conductivity type dopants having high dopant density.

Referring to FIG. 2C, the N+ drain 210 and N+ source 216 are formed by masked implant of N conductivity dopants with high dopant density. A mask alignment process (not shown) forms the separation between the top gate 206 and the drain 210. Also illustrated in FIG. 2C is the formation of the P+ non-depleting region 220. In one method, the formation of the non-depleting region 220 is done by the masked implant of extra P conductivity type dopants into a portion of the top gate 206. In another method, the non-depleting region 220 is formed by a masked introduction of a layer used elsewhere in the process of fabricating the device, such as the P– body 214 (P– body shield region 214) or the body contact 218. This latter method eliminates the need to introduce extra processing steps in the fabrication of the MOS device 200. As illustrated in FIG. 2D, the insulation layer 208 is deposited on the working surface 230 of the substrate 202. Contact openings 240, 242 and 244 are etched through the insulation layer 208 to expose portions of the body contact 218, the source 216 and the drain 210. In addition gate 222 is formed overlaying a select portion of the insulation layer 208.

A NDMOS with a non-depleted portion of the type illustrated in FIG. 2 has been simulated and optimized to have a voltage breakdown similar to a device structure having a totally depletable top gate 206. In this exemplary simulation, the length of the non-depletable portion was 1.5 microns along the working surface 230 of the substrate 202. The non-depleting region 220 was formed by a masked implant of the same dose and energy used on the depleted top gate 206. The integrated dose for the depleted portion was reduced by approximately 20% compared to that used in the device with a total depleted top extension. In this simulation, the breakdown voltage for both the depletable and non-depletable versions was between 400V and 415V.

In one embodiment of FIG. 2, the integrated dose of the second non-depleting portion 207 of the top gate 206 is set by receiving the first depleting portion 205 implant plus a second equal implant so that the final integrated dose of the second non-depleting portion 207 of the top gate 206 twice that of the first depleting portion 205 of the top gate. In one embodiment, the second non-depleting portion 207 of the top gate 206 has a net doping of about $2 \times 10^{12}$ ions/cm$^2$ and the first depleting portion 205 has a net doping of about $1 \times 10^{12}$ ions/cm$^2$. In further embodiments, the second non-depleting portion has a net doping greater than $2 \times 10^{12}$ ions/cm$^2$. Still further in other embodiments, the drift region 204 (or extended drain 204) has a net integrated doping of more than $1 \times 10^{12}$ ions/cm$^2$ to reduce ON resistance. Moreover, in another embodiment with reduced ON resistance, the extended drain 204 has a net integrated doping of about $2 \times 10^{12}$ ions/cm$^2$.

Figure 2E:
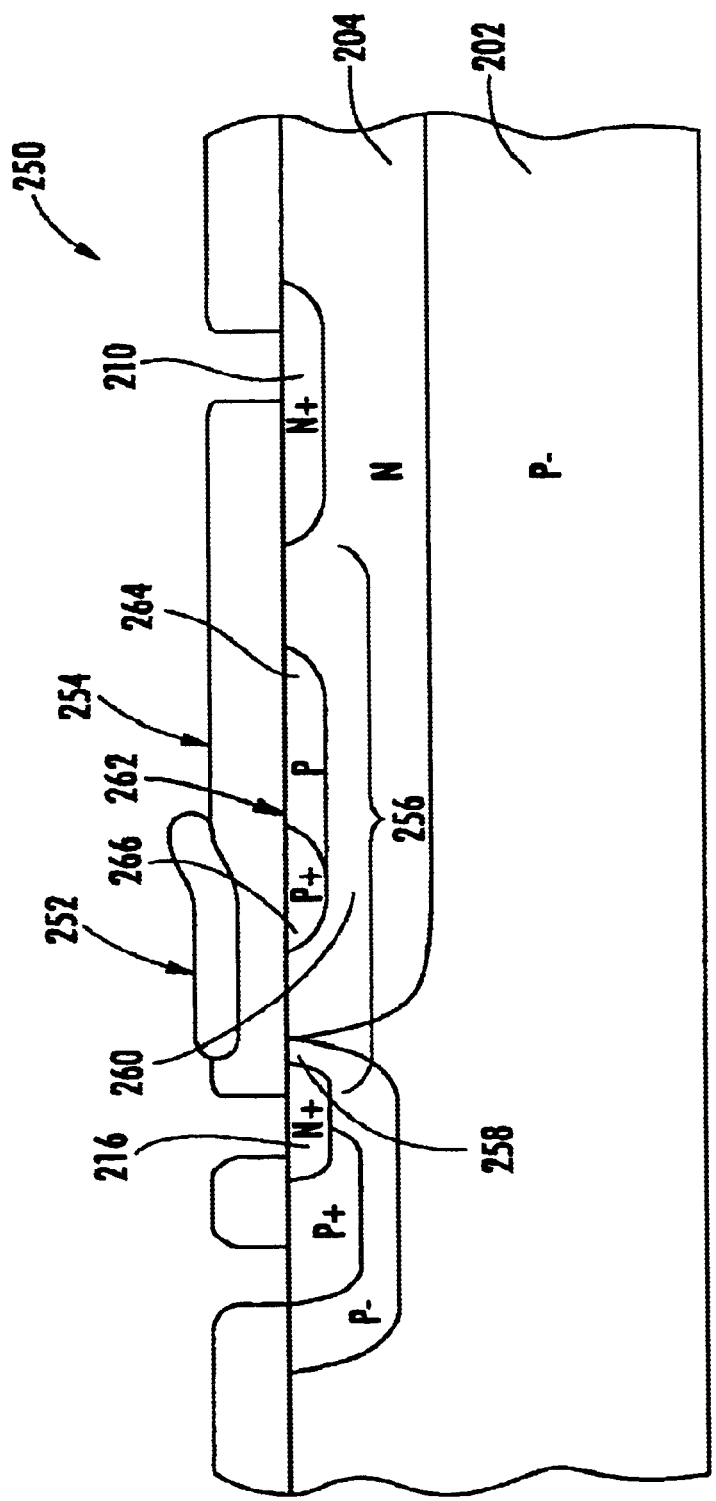
FIG. 2E is a cross-sectional of one embodiment of a integrated MOS/JFET transistor device of one embodiment of the present invention.

Referring to FIG. 2E an embodiment of an integrated MOS/JFET transistor device 250 of the present invention is illustrated. The integrated MOS/JFET transistor device 250 comprises an insulated gate field-effect transistor 252 and a top and bottom gate junction field-effect transistor 254 integrated in a semiconductor substrate 202. Also included is a source region 216 and a drain region 210. A dual channel path 256 is formed in the semiconductor substrate 202 between the source and drain regions 216 and 210. The dual channel path 256 comprises an insulated gate-controlled channel region 258 that has a first conductivity type in the presence of a channel inducing gate voltage. The insulated gate controlled channel region 258 is contiguous with a top and bottom gate junction field-effect transistor channel region 260 of the first conductivity type. Moreover, the source region 216 adjoins the insulated gate-controlled channel region 258 and the drain region 210 adjoins the top and bottom gate junction field-effect transistor channel region 260. A first portion 266 of a top and bottom gate junction field effect transistor top gate 262 comprises a higher integrated doping than the remainder (second portion 264) of the top and bottom gate junction field effect transistor top gate 262. The first portion 266 of the top and bottom gate junction field effect transistor top gate 262 having the higher integrated doping does not totally deplete during device operation.

In one embodiment of FIG. 2E, the first portion 266 of the top and bottom gate junction field effect transistor top gate 262 has an integrated doping of at least $2 \times 10^{12}$ ions/cm$^2$. In another embodiment, the first portion 266 of the top and bottom gate junction field effect transistor top gate 262 has an integrated doping of about $2 \times 10^{12}$ ions/cm$^2$. In still another embodiment, the second portion 264 of the top and bottom gate junction field effect transistor top gate 262 not having the higher integrated doping totally depletes before drain to body breakdown is reached.

Figure 3:
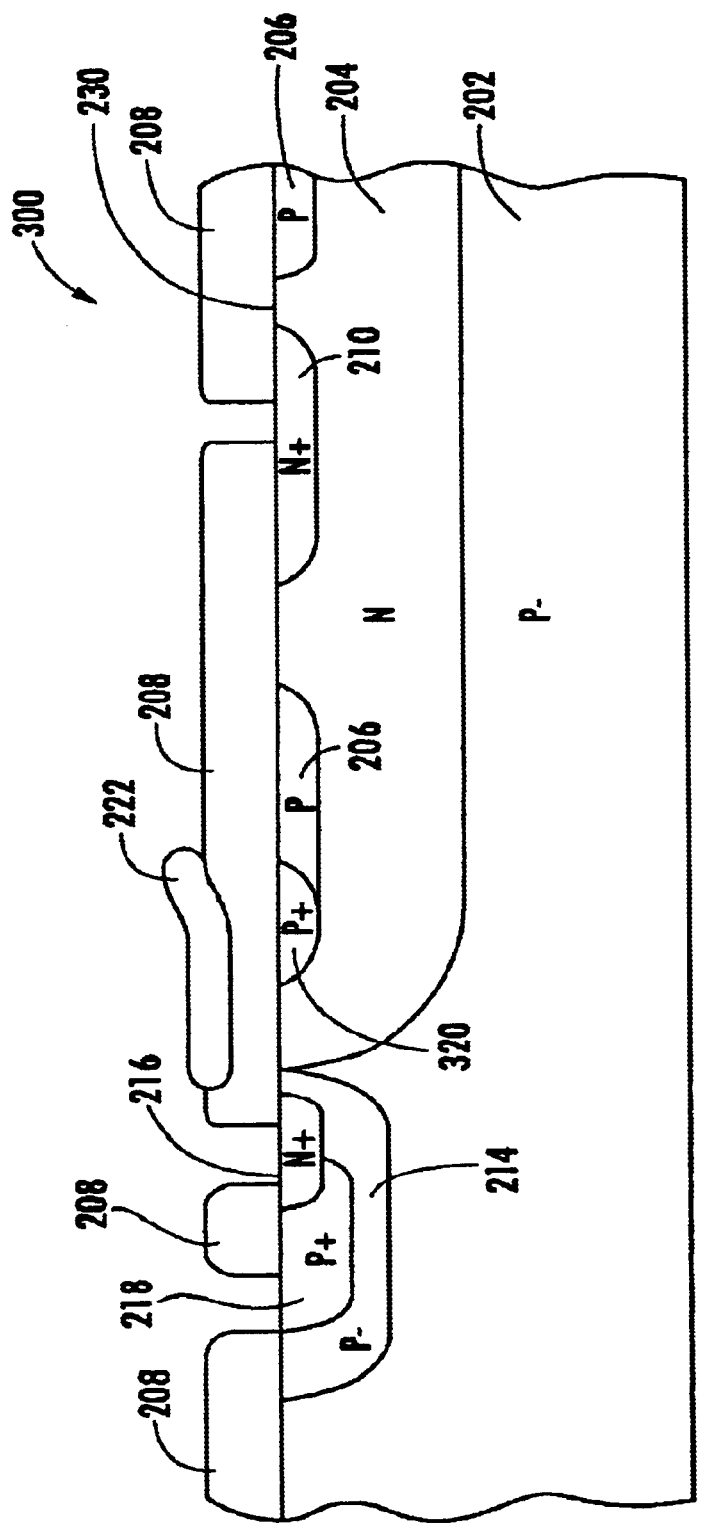
FIG. 3 is a cross-sectional view of another embodiment of the present invention.

The depth of the non-depleting region 220 and 266 of FIGS. 2 and 2E respectfully, is preferably shallow enough to not significantly increase the resistance of the portion of the drift region 204 below the non-depleting region 106. In fact, in one embodiment, a MOS device 300 has a non-depleting region that only extends into the top gate 206. This embodiment is illustrated in FIG. 3.

Another embodiment of a MOS device 400 of the present invention is illustrated in FIG. 4. In this embodiment, a N– drift region 404 is formed epitaxially on a P– substrate 402. Further, a source 414 is formed within a body region 412 adjacent a working surface 430 of the drift region 404. As illustrated, this embodiment further includes a N+ drain 406, a P top gate 410, an insulating layer 408 and a gate 416. Moreover, this embodiment includes a non-depleting region 420 that extends from the working surface 430 of the drift region 404 through a portion of the top gate 410. In this embodiment, the non-depleting region 420 extends through the top gate 410 into the drift region 404. In another embodiment illustrated in FIG. 5, the non-depleting region 520 extends only into a portion of the top gate 410. This embodiment ensures that the resistance of that portion of the drift region 404 below the non-depleting region 520 is not significantly increased.

Figure 6:
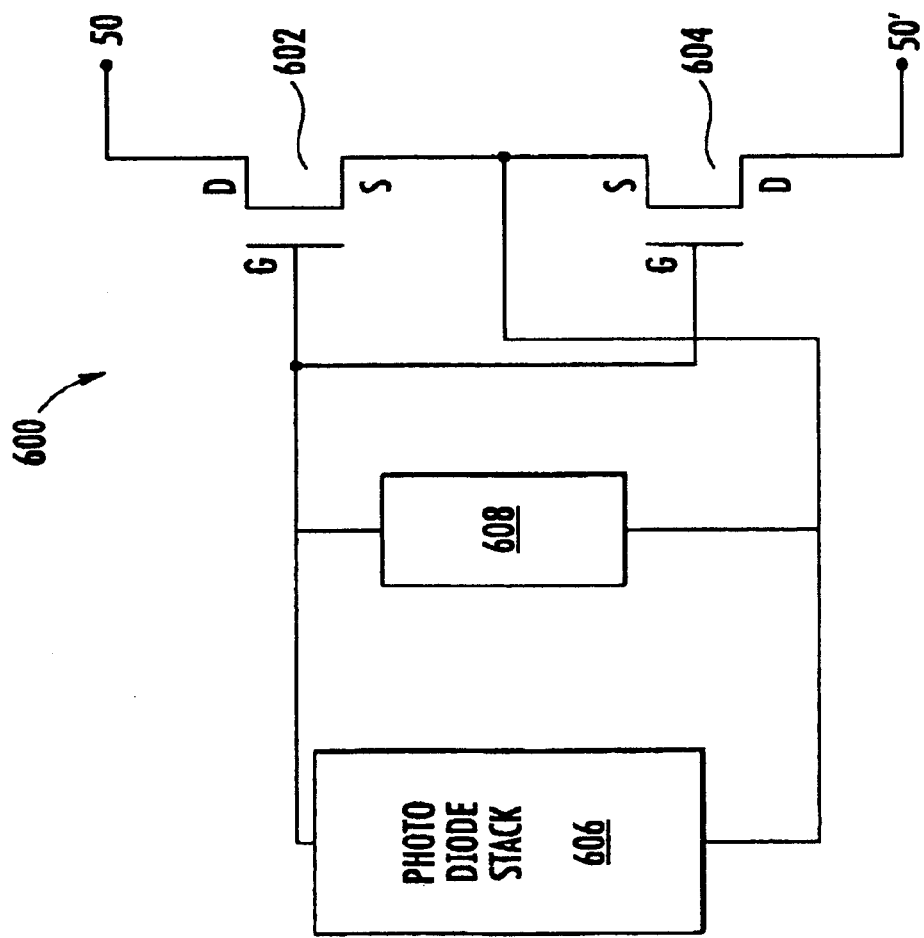
FIG. 6 is a block diagram solid state relay of one embodiment of the present invention.

The present invention has many applications in integrated circuits. Such applications include liner switches in solid state relays circuits, telecommunication switching circuits, switching power supply circuits and high voltage current source circuits. For example, a solid state relay circuit 600 of one embodiment of the present invention is illustrated in FIG. 6. The relay circuit 600 includes a pair of high voltage NDMOS transistors 602 and 604 of the present invention. Moreover, the relay circuit 600 includes a photo diode stack 606, a turn off and gate protection circuit 608. The photo diode stack 606 is used to drive voltage to the source S and gate G of each lateral NDMOS 602 and 604. Generally, the photo diode stack 606 is illuminated by a light emitting diode (not shown). The turn off and gate protection circuit 608 is coupled in parallel with the photo diode stack 606 to discharge any gate-source capacitance when the photo diode stack 606 is not driving voltage to the source S and gate G of each lateral NDMOS 602 and 604. As illustrated, drain D of lateral NDMOS 602 is coupled to switch terminal SO and drain D of NDMOS 604 is coupled to switch terminal SO'.

Photo diodes in the photo diode stack 606 have open circuit voltage and a short circuit current when illuminated. Moreover, a set of N photo diodes are connected in series to form the photo diode stack 606. An open circuit voltage of the diode stack 606 will be N times the open circuit voltage of a single photo diode. Moreover, the short circuit current of the photo diode stack 606 is equal to that of a single photo diode. Typically, an open circuit voltage of approximately 0.4V and a short circuit current of approximately 100 nA is produced by each photo diode in stack 606. A load comprising the gate capacitances of the two lateral NDMOS devices 602 and 604 is coupled to the photo diode stack 606 in the solid state relay 600. The gate capacitance is shunted by the turn off and gate protection circuitry 608 coupled in parallel with the photo diode stack 606. An equilibrium gate source voltage of the lateral NDMOS devices 602 and 604 in an off condition is 0V.

When the light emitting diode is turned on, illuminating the photo diode stack 606, the short circuit current of the photo diode stack 606 begins to charge the gate capacitance of lateral NDMOS devices 602 and 604. A gate-source voltage of each lateral NDMOS devices 602 and 604 rises as the respective gate capacitance charges until reaching the stack open circuit voltage. The number of photo diodes in the photo diode stack 606 is chosen such that its open circuit voltage is larger than the threshold voltages of the lateral NDMOS devices 602 and 604. Consequently, the lateral NDMOS devices 602 and 604 turn on when the stack is illuminated thereby presenting the ON resistance of the lateral NDMOS devices 602 and 604 in series with the switch terminals S0 and S0'.

Lateral NDMOS device 602 and 604 are coupled in series to form a switch to block relatively large voltages, of both polarities, across the switch terminals S0 and S0' when the switch is off. This exploits the fact that the lateral NDMOS devices 602 and 604 each have asymmetric breakdown with the drain to source breakdown being relatively large while the source to drain breakdown is relatively small (often as small as a diode forward voltage). By having the lateral NDMOS devices 602 and 604 coupled in series, the drains D of the devices 602 and 604 are coupled to their associated switch terminals S0 and S0'. When switch terminal S0 has a positive voltage that is more positive than the voltage on switch terminal S0', the drain junction of the lateral NDMOS device 602 blocks the applied voltage. Moreover, when switch terminal S0' has a positive voltage that is more positive that the voltage on switch terminal S0, the drain junction of lateral NDMOS device 604 blocks the applied voltage.

Turn off of the solid state relay 600 is initialized when the LED is turned off. An output current of the photo diode stack 606 then goes to 0 amps. The turn off and gate protection circuit 608, which in its simplest form may comprise a relatively large resistor, discharges the gate capacitance of gate G of the lateral NDMOS devices 602 and 604 thereby taking the gate source voltage back to 0V on both lateral NDMOS devices 602 and 604.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A metal-oxide-semiconductor transistor comprising:
    a semiconductor body of a first or a second conductivity type having a surface;
    a pair of laterally spaced source and drain pockets of semiconductor material of a second conductivity type within said semiconductor body and adjoining the semiconductor body surface;
    an extended drain region of the second conductivity type extending laterally in at least one direction away from said drain pocket and contiguous with the semiconductor body surface;
    a top gate region within and forming a pn junction with said extended drain region and of the first conductivity type;
    a higher-doped pocket of semiconductor material of the first conductivity type within said top gate region and having a higher integrated doping than said top gate region;
    an insulating layer on the surface of said semiconductor body and covering at least that portion of the surface between said source pocket and a farthest edge, with respect to said drain pocket, of said extended drain region;
    a gate on said insulating layer and electrically isolated from said semiconductor body thereunder forming a channel laterally between said source pocket and a nearest point of said extended drain region, said gate controlling, by field-effect, the flow of current thereunder through the channel; and
    the top gate consisting of a depletion portion adapted to operate as a junction field-effect transistor gate that totally depletes at relatively high operating voltages of the metal-oxide-semiconductor transistor and a non-depletion portion formed from the higher doped pocket in the top gate adapted to remain non-depleted during the metal-oxide-semiconductor transistor operation.

2. The metal-oxide-semiconductor transistor of claim 1, wherein the depletion portion of the top gate has a net doping of about $1 \times 10^{12}$ ions/cm$^2$.

3. The metal-oxide-semiconductor transistor of claim 1 wherein the extended drain region is a carrier drift region operating as a junction field-effect transistor channel.

4. The metal-oxide-semiconductor transistor of claim 1 wherein the doping concentration of the higher-doped pocket is established to avoid depletion in the higher-doped pocket.

5. The metal-oxide-semiconductor transistor of claim 1 wherein the integrated dose of the higher-doped pocket is about $2 \times 10^{12}$ ions/cm$^2$.

6. The metal-oxide-semiconductor transistor of claim 1 wherein the length of the higher-doped pocket is approximately 1.5 microns.

7. The metal-oxide-semiconductor transistor of claim 1 wherein the junction depth of the higher-doped pocket is less than the junction depth of the extended drain region.

8. The metal-oxide-semiconductor transistor of claim 1 wherein the higher-doped pocket is a region of the semiconductor body.

9. The metal-oxide-semiconductor transistor of claim 1 further comprising a contact of the first conductivity type for the semiconductor body, wherein said body contact adjoins the semiconductor surface.

10. The metal-oxide-semiconductor of claim 9 wherein the higher-doped pocket of semiconductor material of the first conductivity type has a doping profile substantially similar to the doping profile of the body contact.

11. The metal-oxide-semiconductor transistor of claim 1 further comprising a bipolar junction transistor, wherein the higher-doped pocket is formed as a region in the base of the bipolar junction transistor.

12. The metal-oxide-semiconductor transistor of claim 1 wherein the higher-doped pocket of semiconductor material is adjacent the gate.

13. An integrated MOS/JFET transistor device comprising an insulated gate field-effect transistor and a top and bottom gate junction field-effect transistor integrated in a semiconductor substrate, comprising a source region, and a drain region and a dual channel path formed in said semiconductor substrate between said source and said drain regions, said dual channel path comprising an insulated gate-controlled channel region having a first conductivity type in the presence of a channel inducing gate voltage, said insulated gate controlled channel region being contiguous with a top and bottom gate junction field-effect transistor channel region of the first conductivity type, and wherein said source region adjoins said insulated gate-controlled channel region and said drain region adjoins said top and bottom gate junction field-effect transistor channel region, and wherein a portion of a top and bottom gate junction field effect transistor top gate comprises a higher integrated doping than the remainder of said top and bottom gate junction field effect transistor top gate, further wherein the portion of the top gate with a higher integrated doping is adapted to not totally deplete during operation of the integrated MOS/JFET transistor while the remaining portion of the top gate is adapted to deplete during operation of the integrated MOS/JFET transistor.

14. The integrated MOS/JFET transistor of claim 13, wherein the remaining depletion portion of the top gate has a net doping of about $1 \times 10^{12}$ ions/cm$^2$.

15. The integrated MOS/JFET transistor device of claim 13 wherein the portion of the top and bottom gate junction field effect transistor top gate having the higher integrated doping has an integrated doping of at least $2 \times 10^{12}$ ion/cm$^2$.

16. The integrated MOS/JFET transistor device of claim 13 wherein the portion of the top and bottom gate junction field effect transistor top gate having the higher integrated doping has an integrated doping of about $2 \times 10^{12}$ ions/cm$^2$.

17. The integrated MOS/JFET transistor device of claim 13 wherein the portion of the top and bottom gate junction field effect transistor top gate not having the higher integrated doping totally depletes before drain to body breakdown is reached.

18. A lateral MOS device for an integrated circuit comprising:
an island of semiconductor bulk material of a first conductivity type with low dopant density having a first surface;
a source of a second conductivity type with high dopant density formed in the island adjacent the first surface of the island;
a drain of the second conductivity type with high dopant density formed in the island adjacent the first surface of the island and a select distance from the source;
a top gate of the first conductivity type formed in the island laterally positioned between the source and the drain, the top gate is further formed adjacent the surface of the island;
a gate generally positioned laterally between the source and the top gate;
an insulating layer positioned between the gate and the first surface of the island;
a drift region of the second conductivity type adjacent the first surface of the island and extending laterally beneath the first surface of the island at least from the gate to the drain; and
the top gate consisting of a non-depleting portion and a depletion portion, the non-depleting portion being formed from a non-depleting region of the first conductivity type with high dopant density extending from the first surface of the island into a first portion of the top gate, the non-depleting portion adapted to remain non-depleted during operation of the lateral MOS device, the depleting portion adapted to totally deplete at relatively high operating voltages of the lateral MOS device.

19. The lateral MOS device for an integrated circuit of claim 18, wherein the non-depleting region further extends from the first surface of the island through the first portion of top gate into the drift region.

20. The lateral MOS device for an integrated circuit of claim 18, wherein a portion of the top gate under-laps a portion of the gate.

21. The lateral MOS device for an integrated circuit of claim 18, wherein the length of the non-depleting region is approximately 1.5 microns along the first surface of the island.

22. The lateral MOS device for an integrated circuit of claim 18, wherein the first conductivity type is a P-type conductivity type and the second conductivity type is a N-type conductivity type.

23. The lateral MOS device for an integrated circuit of claim 18, wherein the first conductivity type is a N-type conductivity type and the second conductivity type is a P-type conductivity type.

24. The lateral MOS device for an integrated circuit of claim 18, wherein a channel is formed between the source and the top gate and the gate controls the flow of current through the channel by field effect.

25. The lateral MOS device for an integrated circuit of claim 18, wherein the second depleting portion of the top gate is laterally positioned between the first non-depleting portion of the top gate and the drain.

26. The lateral MOS device for an integrated circuit of claim 25, wherein the second depleting portion of the top gate operates as a junction filed effect transistor gate that depletes during operation of the lateral MOS device while the first non-depleting portion of the top gate remains undepleted.

27. A solid state relay for an integrated circuit comprising:
  a photo diode stack to drive a voltage having a first output and a second output;
  a first high voltage lateral DMOS having a gate, source and drain, the gate of the first high voltage DMOS is coupled to the first output of the photo diode stack, the source of the first high voltage DMOS is coupled to the second output of the photo diode stack;
  a second high voltage lateral DMOS having a gate, source and drain, the gate of the second high voltage lateral DMOS is coupled to the first output of the photo diode stack, the source of the second high voltage lateral DMOS is coupled to the second output of the photo diode stack; and
  wherein the first and second high voltage lateral DMOS comprise,
    a substrate of a first conductivity type with low dopant density having a first surface,
    a body region of the first conductivity type adjacent the first surface of the substrate,
    a source of a second conductivity type with high dopant density in the body region adjacent the first surface of the substrate,
    a drain of the second conductivity type with high dopant density adjacent the first surface of the substrate and a select distance from the source,
    a top gate of the first conductivity type formed between the source and the drain and adjacent the first surface of the substrate, the top gate consisting of a first depletion portion adapted to totally deplete during normal operation of the high voltage lateral DMOS at relatively high operating voltage levels and a non-depleting region of the first conductivity type with high dopant density extending vertically from the first surface of the substrate into a portion of the top gate thereby forming a second non-depletion portion of the top gate adapted to not totally deplete during normal operation of the high voltage lateral DMOS,
    an insulating layer overlaying at least a portion of the first surface of the substrate,
    a gate overlaying a portion of the insulating layer, the gate generally positioned laterally between the source and the top gate, and
    a drift region of a second conductivity type with low dopant density adjacent the first surface of the substrate and extending laterally below the first surface of the substrate at least from the gate to the drain.

28. The solid state relay for an integrated circuit of claim 27, wherein a portion of the top gate under-laps portion of the gate of each first and second high voltage lateral DMOS.

29. The solid state relay for an integrated circuit of claim 27, wherein the first depletion portion of the top gate has a net doping of about $1 \times 10^{12}$ ions/cm$^2$.

30. The solid state relay for an integrated circuit of claim 27, wherein the length of the non-depleting region of each first and second high voltage lateral DMOS is approximately 1.5 microns along the second surface of the drift region.

31. The solid state relay circuit of claim 27, further comprising:
  a turn off and gate protection circuit coupled in parallel with photo diode stack to discharge any gate source capacitance when the photo diode stack is not driving voltage to the first and second high voltage lateral DMOS.

32. The solid state relay of claim 27, further comprising:
  a first switch terminal coupled to the drain of the first high voltage lateral DMOS; and
  a second switch terminal coupled to the drain of the second high voltage lateral DMOS.

* * * * *

UNITED STATES PATENT AND TRADEMARK OFFICE
CERTIFICATE OF CORRECTION

PATENT NO. : 6,894,349 B2  Page 1 of 1
APPLICATION NO. : 10/104342
DATED : May 17, 2005
INVENTOR(S) : Beasom It is certified that error appears in the above-identified patent and that said Letters Patent is hereby corrected as shown below:

At Claim 28, Column 14, Line 16, please insert the letter --a-- before the second occurrence of "portion"

Signed and Sealed this

Fifteenth Day of April, 2008

JON W. DUDAS
*Director of the United States Patent and Trademark Office*